(12) United States Patent
Kim

(10) Patent No.: US 7,246,304 B2
(45) Date of Patent: Jul. 17, 2007

(54) DECODING ARCHITECTURE FOR LOW DENSITY PARITY CHECK CODES

(75) Inventor: Sungwook Kim, Saint Paul, MN (US)

(73) Assignee: DSP Group Inc, Santa Clara, CA (US)

( * ) Notice: Subject to any disclaimer, the term of this patent is extended or adjusted under 35 U.S.C. 154(b) by 568 days.

(21) Appl. No.: 10/234,059

(22) Filed: Aug. 30, 2002

(65) Prior Publication Data

US 2003/0104788 A1    Jun. 5, 2003

Related U.S. Application Data

(60) Provisional application No. 60/316,473, filed on Sep. 1, 2001.

(51) Int. Cl.
*G06F 11/00*    (2006.01)

(52) U.S. Cl. .................. 714/801; 714/803

(58) Field of Classification Search .............. 714/801, 714/752, 786, 762, 800, 803, 804, 772
See application file for complete search history.

(56) References Cited

U.S. PATENT DOCUMENTS

| | | | | |
|---|---|---|---|---|
| 4,295,218 | A * | 10/1981 | Tanner | 714/762 |
| 6,396,871 | B1 | 5/2002 | Gelblum et al. | |
| 6,512,739 | B1 * | 1/2003 | Heidari et al. | 370/210 |
| 6,857,097 | B2 * | 2/2005 | Yedidia et al. | 714/752 |
| 6,895,547 | B2 * | 5/2005 | Eleftheriou et al. | 714/801 |
| 6,965,652 | B1 * | 11/2005 | Burd et al. | 375/341 |
| 7,000,174 | B2 * | 2/2006 | Mantha et al. | 714/790 |
| 2002/0021770 | A1 * | 2/2002 | Beerel et al. | 375/340 |
| 2002/0042899 | A1 * | 4/2002 | Tzannes et al. | 714/786 |

OTHER PUBLICATIONS

"Low Density Parity Check Codes: Decoding Analysis" Henry D. Pfister and Paul H. Siegel, Signal Transmission and Recording (STAR) Group, University of California, San Diego, Jan. 25, 2000.
"Lecture Notes for Math 696 Coding Theory Iterative Decoding" Michael E. O'Sullivan, www.rohan.sdsu.edu/-mosulliv, Mar. 18, 2002.
"Reed-Solomon Codes" Martyn Riley Iain Richardson, 4i2i Communications Ltd. Mar. 31, 2000, http://www.4i2i.com/_reed_solomon_codes.htm.
"Low density parity check codes", R. G. Gallager, IRE Trans. Information Theory, vol. IT-8, pp. 21-28, Jan. 1962.

(Continued)

*Primary Examiner*—Guy Lamarre
*Assistant Examiner*—Fritz Alphonse
(74) *Attorney, Agent, or Firm*—Shumaker & Sieffert, P.A.

(57) ABSTRACT

Architectures for decoding low density parity check codes permit varying degrees of hardware sharing to balance throughput, power consumption and area requirements. The LDPC decoding architectures may be useful in a variety of communication systems in which throughput, power consumption, and area are significant concerns. The decoding architectures implement an approximation of the standard message passing algorithm used for LDPC decoding, thereby reducing computational complexity. Instead of a fully parallel structure, this approximation permits at least a portion of the message passing structure between check and bit nodes to be implemented in a block-serial mode, providing reduced area without substantial added latency.

52 Claims, 13 Drawing Sheets

OTHER PUBLICATIONS

"Low Density Generator Matrix Interpretation of Parallel Concatenated Single Bit Parity Codes", Travis Oening and J. Moon, to appear in IEEE Trans. Magn.

"Constrained Coding and Soft Iterative Decoding For Storage", John L. Fan, Stanford University, pp. 50-52, Dec. 1999.

"Reduced Complexity Iterative Decoding of Low-Density Parity Check Codes Based On Belief Propagation", Marc P. C. Fossorier, M. Mihaljevic and H. Imai, IEEE Trans. On Communications, vol. 47, No. 5, May 1999.

"Low-Density Parity-Check (LDPC) Coded OFDM Systems" H. Futaki and T. Ohtsuki, IEEE Vehicular Technology Conference 54th, 2001 Fall, Aug. 2001, vol. 1, pp. 82-86.

"Efficient Implementations of the Sum-Product Algorithm for Decoding LDPC Codes" Xiao-Yu Hug, Evangelos Eleftheriou, Dieter-Michael Arnold and Ajay Dholakia, IEEE Global Telecommunications Conference, Sep. 2001, vol. 2, pp. 1036-1036E.

"VLSI Architectures for Iterative Decoders in Magnetic Recording Channels" Engling. Yeo, Payam Pakzak, Borivoje Nikolic and Venkat Anantharam, IEEE Transactions on Magnetics, Mar. 2001, vol. 37, Issue 2, Part 1, pp. 748-755.

"A 1-GHz Low-Power Transposition Memory Using New Pulse-Clocked D Flip-Flops" Po-Hui Yang, Jinn-Shyan Wang and Yi-Ming Wang, IEEE International Symposium on Circuits and Systems, May 2000, vol. 5, pp. 665-668.

\* cited by examiner

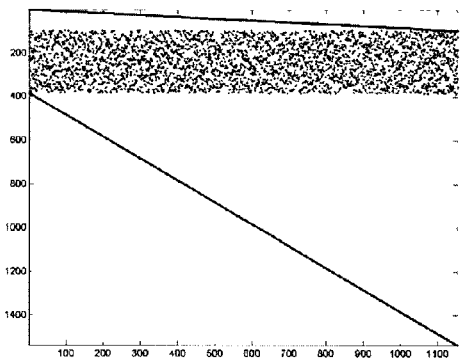
FIG. 6A     FIG. 6B
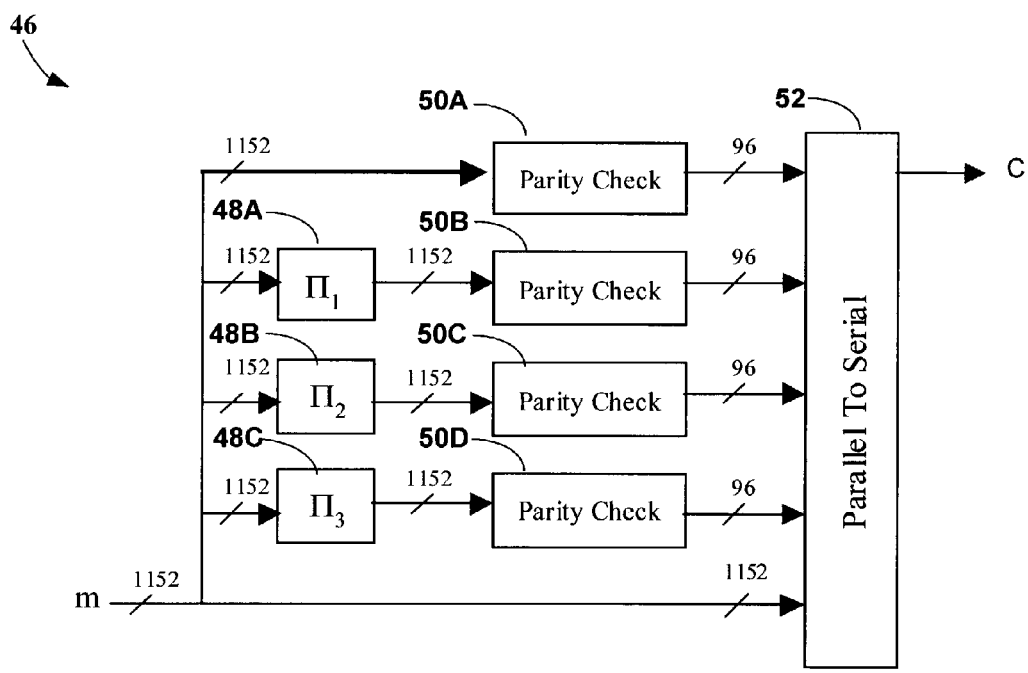
FIG. 7

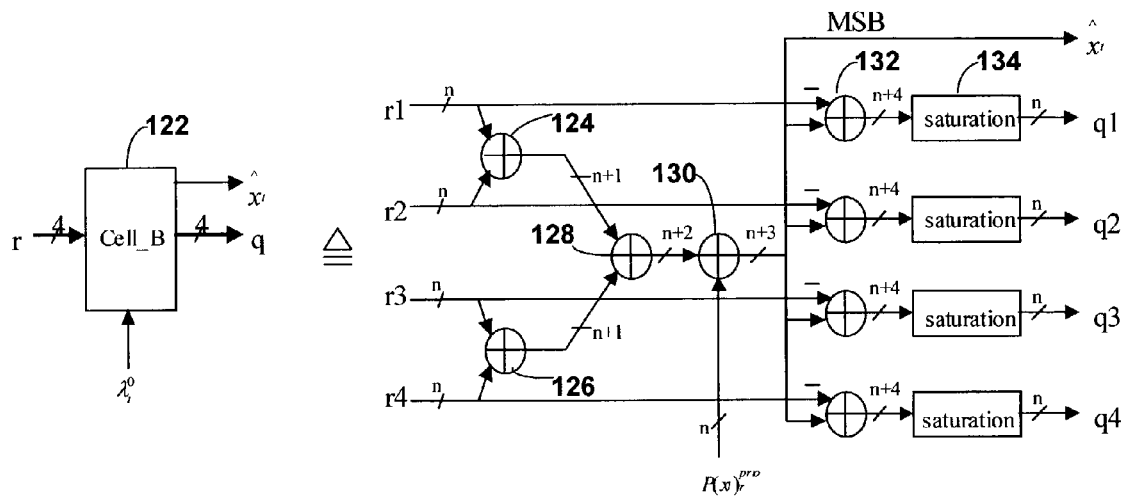
FIG. 17
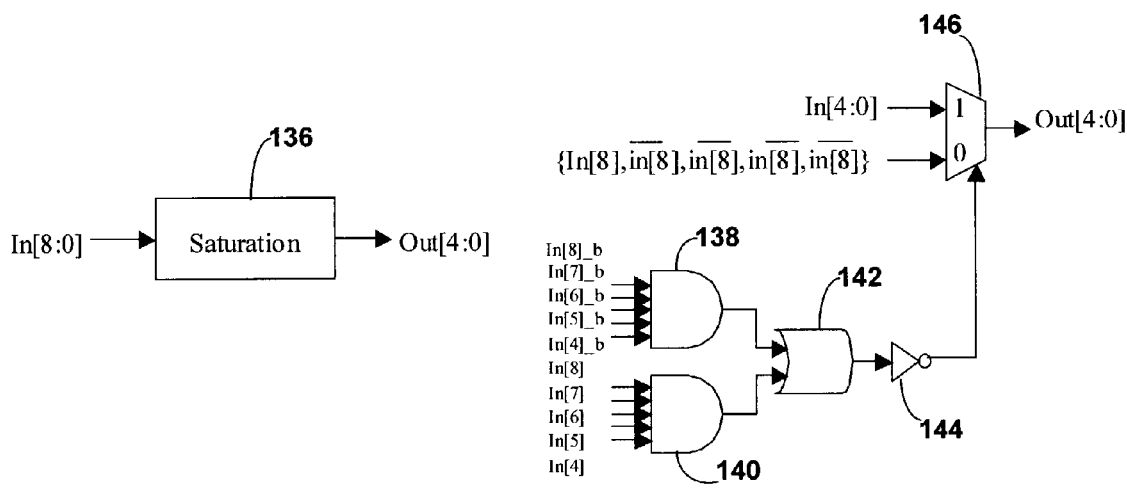
FIG. 18A  FIG. 18B

DECODING ARCHITECTURE FOR LOW DENSITY PARITY CHECK CODES

This application claims priority from U.S. provisional application Ser. No. 60/316,473, filed Sep. 1, 2001, the entire content of which is incorporated herein by reference.

FIELD

The invention relates to digital communication and, more particularly, to techniques for decoding digital communication signals using low density parity check codes.

BACKGROUND

Forward error correction (FEC) is an important feature of most modem communication systems, including wired and wireless systems. Communication systems use a variety of FEC coding techniques to permit correction of bit errors in transmitted symbols. One coding technique, low density parity coding (LDPC), has been found to provide excellent performance on both the binary symmetric channel and the additive white Gaussian noise (AWGN) channel. As a result, LDPC coding has emerged as a viable alternative to turbo and block turbo coding.

SUMMARY

The invention is directed to architectures for decoding low density parity check codes. The architectures permit varying degrees of hardware sharing to balance throughput, power consumption and area requirements. The LDPC decoding architectures described heroin may be useful in a variety of communication systems, and especially useful in wireless communication systems in which throughput, power consumption, and area are significant concerns.

Decoding architectures, in accordance with the invention, implement an approximation of the standard message passing algorithm used for LDPC decoding, thereby reducing computational complexity. Instead of a fully parallel structure, this approximation permits at least a portion of the message passing structure between check and bit nodes to be implemented in a block-serial mode, providing reduced area without substantial added latency.

Memory for storing messages between check and bit nodes can be constructed using D flip-flops, multiplexers and demultiplexers, leading to reduced power requirements. For example, the decoding architecture can be configured to store incoming messages in fixed positions in memory, taking advantage of the fact that messages in the LDPC decoder change rather slowly as they iterate, to present low switching activity. In addition, in some embodiments, the decoding architectures avoid the need for summations and hookup tables, as typically required by conventional message-passing algorithms. As a result, the decoding architectures can be made more area-efficient.

In one embodiment, the invention provides a low density parity check (LDPC) decoder comprising a first computation unit and a second computation unit. The first computation unit iteratively computes messages for LDPC encoded information from check nodes to bit nodes based on an approximation of the LDPC message passing algorithm. The second computation unit is responsive to the first computation unit and iteratively computes messages for the LDPC encoded information from the bit nodes to the check nodes to produce a hard decoding decision.

In another embodiment, the invention provides a low density parity check (LDPC) decoding method comprising iteratively computing messages for LDPC encoded information from check nodes to bit nodes based on an approximation of the LDPC message passing algorithm in a first computation unit, and responsive to the first computation unit, iteratively computing messages for the LDPC encoded information from the bit nodes to the check nodes to produce a hard decoding decision in a second computation unit.

In an added embodiment, the invention provides a low density parity check (LDPC) decoding method comprising iteratively computing messages for LDPC encoded information from check nodes to bit nodes in block serial mode using shared hardware in a first computation unit and, responsive to the first computation unit, iteratively computing messages for the LDPC encoded information from the bit nodes to the check nodes to produce a hard decoding decision in a second computation unit.

In another embodiment, the invention provides a low density parity check (LDPC) decoder comprising a first computation unit that iteratively computes messages for LDPC encoded information from check nodes to bit nodes in block serial mode using shared hardware, and a second computation unit, responsive to the first computation unit, that iteratively computes messages for the LDPC encoded information from the bit nodes to the check nodes to produce a hard decoding decision.

In an added embodiment, the invention provides a wireless communication device comprising a radio circuit that receives radio frequency signals, a modem that demodulates the received signals, wherein the signals are encoded with low density parity check (LDPC) codes; and an LDPC decoder. The LDPC decoder includes a first computation unit that iteratively computes messages for LDPC encoded information from check nodes to bit nodes based on an approximation of the LDPC message passing algorithm, and a second computation unit, responsive to the first computation unit, that iteratively computes messages for the LDPC encoded information from the bit nodes to the check nodes to produce a hard decoding decision.

In a further embodiment, the invention provides a wireless communication device comprising a radio circuit that receives radio frequency signals, a modem that demodulates the received signals, wherein the signals are encoded with low density parity check (LDPC) codes, and a low density parity check (LDPC) decoder. The LDPC decoder includes a first computation unit that iteratively computes messages for LDPC encoded information from check nodes to bit nodes in block serial mode using shared hardware, and a second computation unit, responsive to the first computation unit, that iteratively computes messages for the LDPC encoded information from the bit nodes to the check nodes to produce a hard decoding decision.

The invention may offer a number of advantages. In general, the use of LDPC coding can provide exceptional performance. For example, LDPC codes are characterized by good distance properties that reduce the likelihood of undetected errors. In addition, LDPC codes permit implementation of low complexity, highly parallelizable decoding algorithms. Parallel processing, in turn, promotes low power consumption, high throughput and simple control logic. Availability of different degrees of serial processing, however, reduces area. Also, the intermediate results on each node of the LDPC decoder tend to converge to a certain value, resulting in low power consumption due to reduced switching activity. Moreover, the architectures contemplated by the invention are capable of delivering such advantages while balancing throughput, power consumption and area, making LDPC more attractive in a wireless communication system.

Additional details of various embodiments are set forth in the accompanying drawings and the description below. Other features, objects and advantages will become apparent from the description and drawings, and from the claims.

BRIEF DESCRIPTION OF THE DRAWINGS

FIG. 6A illustrates a parallel concatenated parity check (PCPC) generator matrix.

FIG. 6B illustrates a plot for the generator matrix of FIG. 6A.

FIG. 7 is a block diagram illustrating an exemplary PCPC encoder configured to generate LDPC codes.

FIG. 17 is a block diagram illustrating the structure of a bit to check computation unit for computing messages from bit to check nodes.

FIG. 18A is a block diagram illustrating a saturation unit for the bit to check computation unit of FIG. 17.

FIG. 18B is a logic diagram illustrating the saturation unit of FIG. 18A in greater detail.

DETAILED DESCRIPTION

Figure 1:
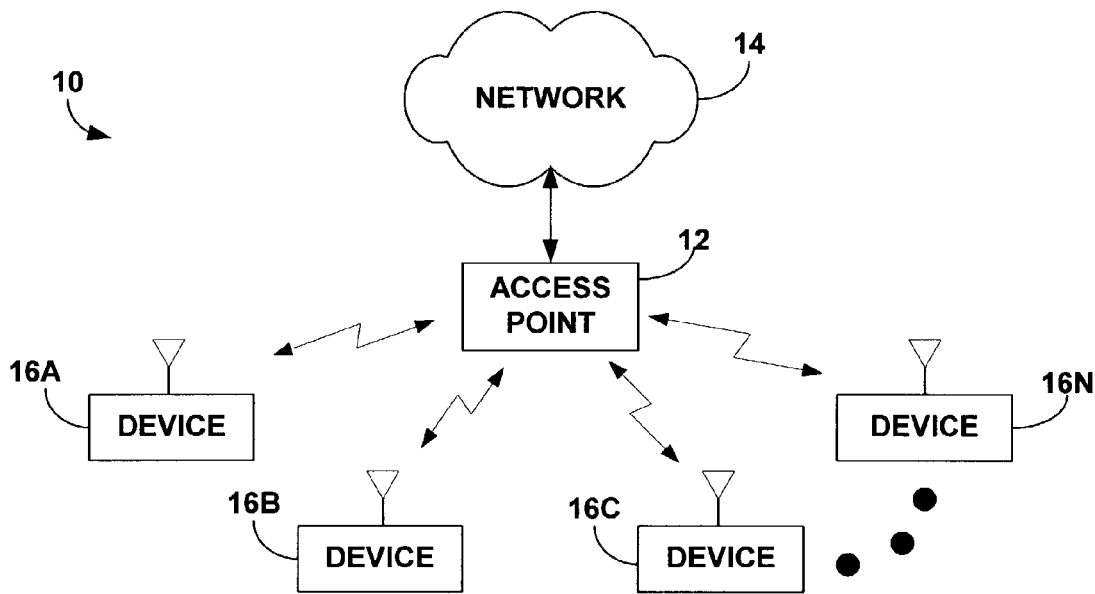
FIG. 1 is a block diagram illustrating a wireless communication network.

FIG. 1 is a block diagram illustrating a wireless communication network 10. As shown in FIG. 1, wireless communication network 10 may include one or more wireless access points 12 coupled to a wired network 14, e.g., via an Ethernet connection. Wireless access point 12 permits wireless communication between wired network 14 and one or more wireless communication devices 16A–16N (hereinafter 16).

Wireless access point 12 may integrate a hub, switch or router to serve multiple wireless communication devices 16. Wireless communication network 10 may be used to communicate data, voice, video and the like between devices 16 and network 14 according to a variety of different wireless transmission standards. For example, wireless communication network 10 may transmit signals based on a multi-carrier communication technique such as OFDM, e.g., as specified by IEEE 802.11a.

Wireless communication network 10 makes use of LDPC coding to support forward error correction of bit errors in symbols transmitted between access point 12 and devices 16. In accordance with the invention, access point 12, devices 16 or both may implement an LDPC decoder architecture that permits varying degrees of hardware sharing. Hardware sharing can be exploited to balance throughput, power consumption and area requirements, as will be described.

The decoding architectures implemented by access point 12 and devices 16 rely on an approximation of the standard message pissing algorithm used for LDPC decoding. Instead of a fully parallel structure, this approximation permits at least a portion of the message passing structure between check and bit nodes to be implemented in a block-serial mode. A degree of block-serial mode implementation can reduce the area requirements of the decoder without substantial added latency. The structure of the decoder architecture will be described in greater detail below. Although the decoder architecture may be useful in wired networks, application within wireless communication network 10 will be described herein for purposes of illustration.

Figure 2:
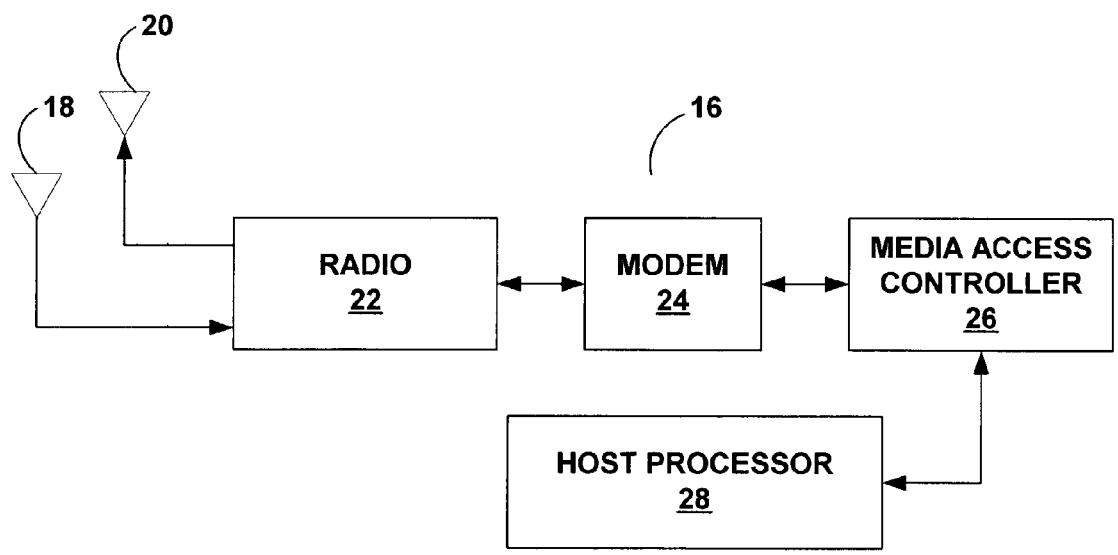
FIG. 2 is a block diagram illustrating a wireless communication device useful in the network of FIG. 1.

FIG. 2 is a block diagram illustrating a wireless communication device 16 in further detail. As shown in FIG. 2, wireless communication device 16 may include an RF receive antenna 18, RF transmit antenna 20, radio 22, modem 24, and media access controller 26 coupled to a host processor 26. Radio 22 and modem 24 function together as a wireless receiver. Wireless communication device 16 may take the form of a variety of wireless equipment, such as computers, personal computer cards, e.g., PCI or PCMCIA cards, personal digital assistants (PDAs), network audio or video appliances, and the like.

RF receive antenna 18 receives RF signals from access point 12, whereas RF transmit antenna 20 transmit RF signals to access point. In some embodiments, receive and transmit antennas 18, 20 may be realized by a common RF antenna used for both reception and transmission.

Radio 22 may include circuitry for upconverting transmitted signals to RF, and downconverting RF signals to baseband. In this sense, radio 20 may integrate both transmit and receive circuitry within a single transceiver component. In some cases, however, the transmit and receive circuitry may be formed by separate transmitter and receiver components. For purposes of illustration, the discussion herein will be generally limited to the receiver and demodulation aspects of radio 22 and modem 24.

Modem 24 encodes information in a baseband signal for upconversion to the RF band by radio 22 and transmission via a transmit antenna. Similarly, and more pertinent to the invention, modem 24 decodes information from RF signals received via antenna 18 and downconverted to baseband by radio 22.

Media access controller 26 interacts with host processor 28 to facilitate communication between modem 24 and a host wireless communication device 16, e.g., a computer, PDA or the like. Hence, host processor 28 may be a CPU within a computer or some other device. Radio 22, modem 24 and media access controller 26 may be integrated on a common integrated circuit chip, or realized by discrete components.

Figure 3:
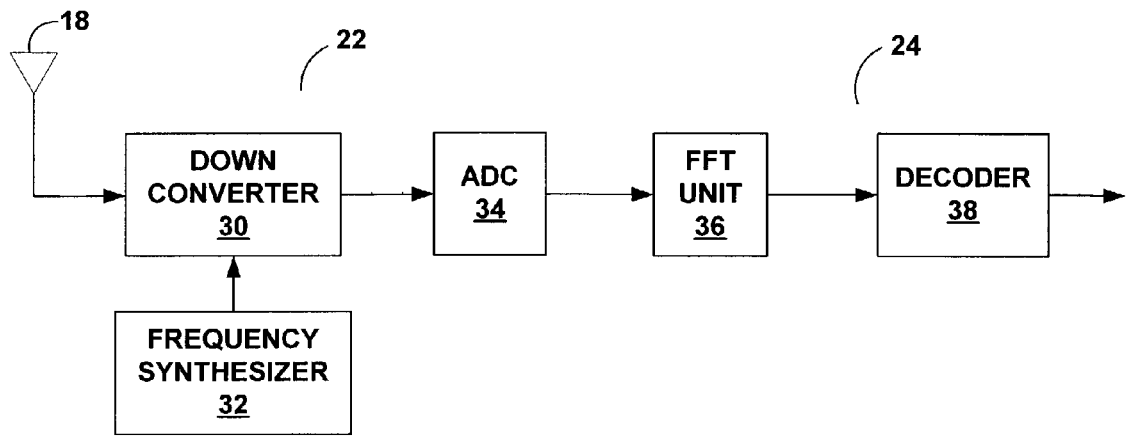
FIG. 3 is a block diagram illustrating a wireless communication device in greater detail.

FIG. 3 is a block diagram illustrating radio and modem circuitry within an access point 12 or wireless communication device 16. Similar radio and modem circuitry may be implemented in wireless access point 12. As shown in FIG. 3, radio 22 includes a downconverter 30 that receives an RF signal via antenna 18. Downconverter 30 mixes the received RF signal with a signal received from a frequency synthesizer 32 to convert the RF signal down to a baseband frequency. Radio 22 also may include a low noise amplifier and other signal conditioning circuitry (not shown in FIG. 3).

Modem 24 includes an analog-to-digital converter (ADC) 34 that produces a digital representation of the baseband signal. ADC 34 may include an amplifier (not shown in FIG. 3) that applies a gain to the analog baseband signal prior to conversion to a digital signal. Circuitry also may be provided to perform a number of functions, such as gain control, signal detection, frame synchronization and carrier frequency offset estimation and correction.

A fast Fourier transform (FFT) unit 36 receives the digital signal from ADC 34 and produces FFT outputs to demodulate the signal. A decoder 38 decodes the FFT outputs from FFT unit 36 to recover the information carried by the received signal. In particular, decoder 38 decodes the information carried by a given tone and produces a stream of serial data for transmission to host processor 28 via MAC 26 (FIG. 2). In addition, decoder 38 implements an LDPC decoder architecture as described herein.

Figure 4:
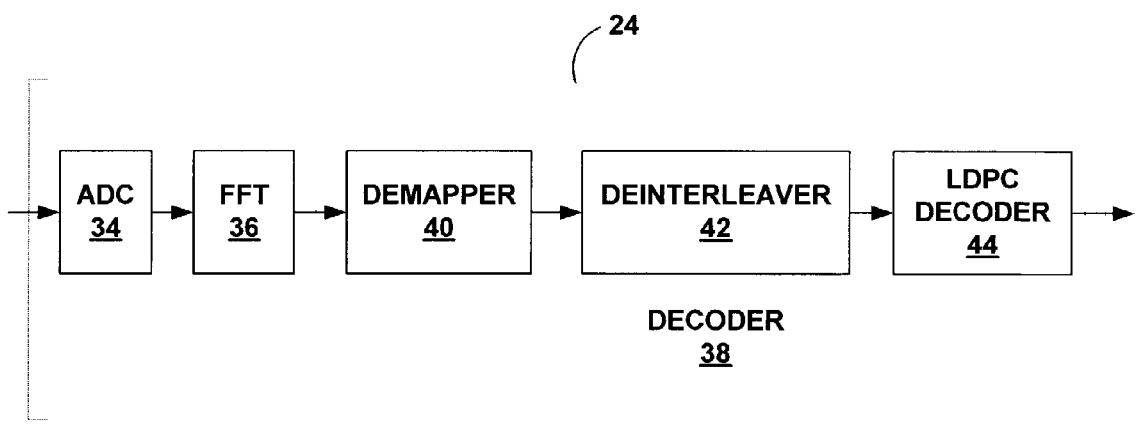
FIG. 4 is a block diagram illustrating a modem associated with a wireless communication device.

FIG. 4 is a block diagram illustrating modem 24 and decoder 38. In addition to ADC 34 and FFT unit 36, modem 24 may include a soft demapper unit 40, deinterleaver unit 42 and LDPC decoder unit 44. Again, similar circuitry may be incorporated in wireless access point 12 or other devices within network 10. Soft demapper unit 40 processes observation samples produced by FFT unit 36 to generate soft decisions $\lambda$ for the transmitted symbols. In particular, the soft decisions may be accompanied by, or take the form of, log likelihood ratios (LLRs). Deinterleaver unit 42 restores the outputs from soft demapper unit 40 to the original order of the symbols prior to transmission. LDPC decoder unit 44 accepts the log likelihood ratios from deinterleaver unit 42 and performs decoding according to the message passing algorithm.

Figure 5:
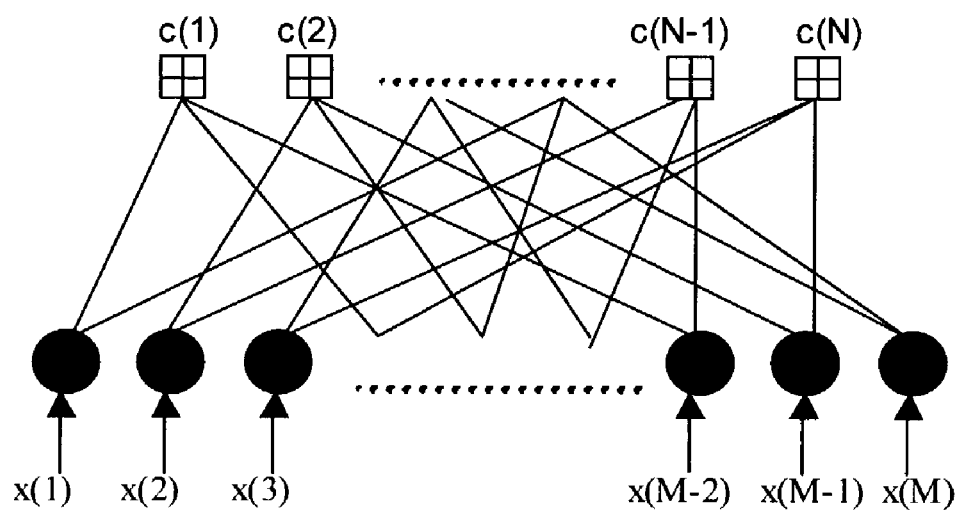
FIG. 5 is a bipartite diagram of an exemplary LDPC code.

FIG. 5 is a bipartite graph of an exemplary LDPC code. In particular, FIG. 5 illustrates the message passing algorithm implemented by LDPC decoder unit 44 to decode LDPC codes. One set of nodes x(1)–x(M) represents the codeword bits (bit nodes), and the other set of nodes c(1)–c(N) represents the parity-check constraints on the bits (check nodes). Edges in the bipartite graph of FIG. 5 connect check nodes c(1)–c(N) to bit nodes x(1)–x(N), and identify the bits that participate in each parity check.

A bit sequence is a codeword if and only if the modulo 2 sum of the bits that neighbor a check node is 0 for each check node. Thus, for a codeword, each bit neighboring a given check node is equal to the modulo 2 sum of the other neighbors. Each message represents an estimate of the bit associated with the particular edge carrying the message. For decoding, messages are exchanged along the edges of the graph and computations are performed at the nodes.

To obtain LDPC codes, the structure of the LDPC encoder at the transmit access point 12 or wireless communication device 16 should be considered. One disadvantage of LDPC codes is that the encoder is generally more complex than the encoder used for turbo codes. The sparse parity check provided by LDPC decoding is advantageous, but makes the LDPC encoder more complex. In particular, it is difficult to construct a sparse generator matrix from the sparse parity check matrix. To obtain a relatively simple encoder structure, a systematic parallel concatenated parity check (PCPC) encoder structure can be used.

An example of a suitable PCPC encoder structure is disclosed in Travis Oenning and J. Moon, "Low Density Generator Matrix Interpretation of Parallel Concatenated Single Bit Parity Codes," IEEE Transactions on Magnetics, vol. 37, pp. 737–741, March 2001, the entire content of which is incorporated herein by reference. The encoding structure in the above-referenced paper is similar to that originally proposed for encoding of parallel-concatenated turbo codes, except that the recursive systematic component codes are replaced with single bit parity check block codes. Decoding still can be viewed from an LDPC perspective by considering the parity check matrix that corresponds to the encoding structure.

FIG. 6A illustrates a generator matrix with (1536, 1152) code and code rate=3/4. FIG. 6B illustrates a plot for the generator matrix of FIG. 6A. A dot in the plot of FIG. 6B represents a 1's element in the generator matrix of FIG. 6A. The codewords are constructed by G*m where G is a generator matrix and m is a message. The parity check blocks operate independently on blocks much smaller than the codeword size to generate single parity bits and enforce either an odd or even parity constraint. Encoding is systematic and message bits can be interleaved using three randomly constructed interleavers denoted by $\Pi_j$, j=1, 2, 3, resulting in permutated sequences. Each submatrix is constructed as: $P_2=\Pi_1(P_1)$, $P_3=\Pi_2(P_1)$, and $P_4=\Pi_3(P_1)$. After interleaving, the parity check block codes generate single bits to enforce even or odd parity. Each of the single bit parity check component codes can be efficiently implemented using a simple logical XOR operation.

FIG. 7 is a block diagram illustrating an exemplary PCPC encoder 46 configured to generate LDPC codes. PCPC encoder 46 is based on the generator matrix G of FIG. 6A. In particular, PCPC encoder 46 includes three permutation units 48A, 48B, 48C, parity check blocks 50A, 50B, 50C, 50D, and a parallel-to-serial converter 52. In operation, PCPC encoder 46 concatenates, in parallel, multiple single bit parity check block codes. The coding scheme in FIG. 7 can be viewed as a low-density generator matrix and decoded as a low-density parity check code. Although encoder 46 is described herein for purposes of illustration, the decoding architecture contemplated by the invention is not limited to use with a particular encoding process or structure.

Figure 8:
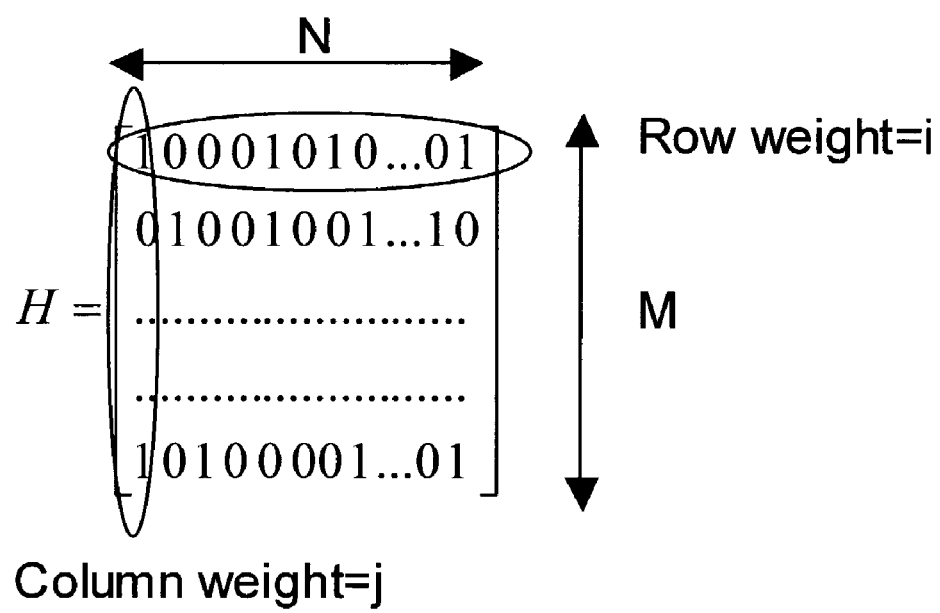
FIG. 8 is diagram illustrating the general structure of an LDPC parity check matrix H.

The architecture implemented by LDPC decoding unit 44 will now be described in greater detail. In general, LDPC codes are linear block codes defined by parity check matrices where the number of non-zero entries is a small proportion of the matrix. FIG. 8 is a diagram illustrating the general structure of an exemplary LDPC parity check matrix H. As shown in FIG. 8, the matrix H has M rows and N columns, where N is the length of a codeword, and the location of a 1 in the parity check matrix indicates that a particular bit is involved in a parity check. The parity check matrix H has a column weight of j and a row weight of i.

Each column of the parity check matrix H corresponds to a particular transmitted bit and each row corresponds to a particular parity checksum. The codeword x corresponds to column vectors that satisfy the parity check constraint.

$$Hx=0 \quad (1)$$

For purposes of example, the parity-check matrix H is assumed to have full row rank. For encoding, it is useful to put H into systematic form [P I], where I is the identity matrix of size M×M, and P is of size M×(N−M). This can be accomplished using Gaussian elimination. In this case, some rearrangement of the columns might be necessary. Then, the codeword x can be divided into messages and parity portions, so that systematic encoding is performed as follows:

$$[P\ I]\begin{bmatrix} x^m \\ x^p \end{bmatrix} = 0 \quad (2)$$

and the generator matrix is given by $$G = \begin{bmatrix} I_{N-M} \\ P \end{bmatrix}.$$

Decoding the codeword can be represented in terms of message passing on the bipartite graph representation of the parity check matrix in FIG. 5. Again, the bits and checks nodes are connected with edges in correspondence with ones in the parity check matrix.

Figure 9A:
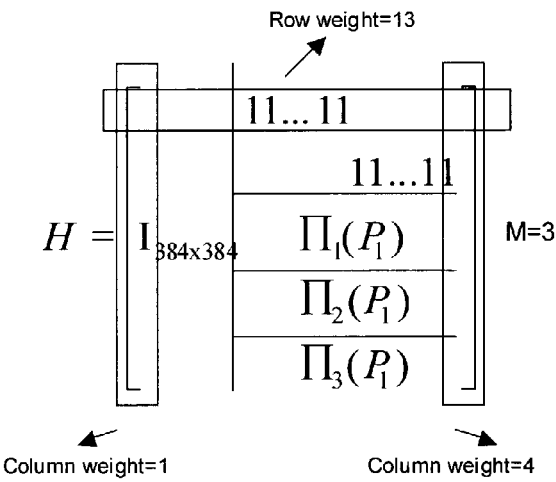
FIG. 9A illustrates an exemplary LDPC parity check matrix H.
Figure 9B:
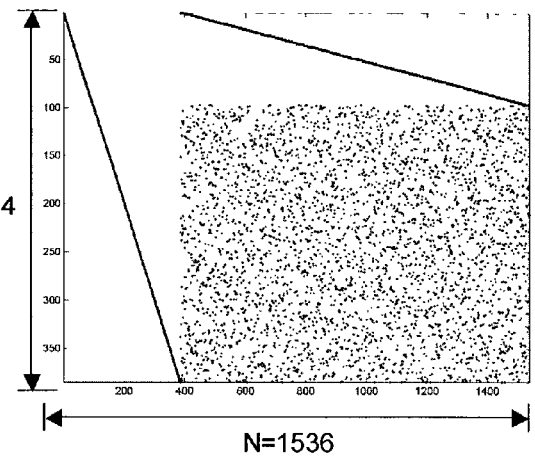
FIG. 9B illustrates a plot for the LDPC parity check matrix H of FIG. 9A.

For decoding, it is necessary to determine the parity check matrix that corresponds to the generator matrix G. As can easily be verified, the parity check matrix H is given by H=[I P], where I denotes an identity matrix, and P is given by $P_T=[H_1\ H_2\ \ldots\ H_P]$. Note that H is already in systematic form so that the generator matrix G is given by $G^T=[P\ I]$. FIG. 9A illustrates a parity check matrix H corresponding to P=4 and using the code rate 8/9. FIG. 9B illustrates a plot for the parity check matrix H of FIG. 9A. A dot in the plot of FIG. 9B represents a 1's element in the parity check matrix of FIG. 9A. Note that not only is the parity check matrix H sparse (low-complexity), but the generator matrix G is sparse as well. The PCPC codes produced by generator matrix G are viewed as LDPC codes. Consequently, the PCPC codes can be decoded using the LDPC message-passing algorithm.

The LDPC decoding algorithm, also known as the message-passing algorithm or the sum-product algorithm, involves a cyclical passing of messages from bit nodes and check nodes, and vice-versa. The two major computational units, or blocks, in LDPC decoder 48 are (1) computation of bit-to-check message from bit nodes to parity check nodes, and (2) computation of check-to-bit messages from parity check nodes to bit nodes. In addition, due to the irregularity of the bipartite graph, LDPC decoder 44 typically will include memory to store intermediate messages between the computational blocks. The probabilities for binary variables can be represented in terms of log-likelihood ratios (LLR). The messages from checks $c_i$ to bits $x_i$ are represented by $$LLR(c_i \to x_i) = LLR(r_{ij}) = \log\left(\frac{r_{ij}(1)}{r_{ij}(0)}\right). \quad (3)$$

Also, the messages from bits $x_i$ to check $c_i$ are represented by $$LLR(x_i \to c_i) = LLR(q_{ij}) = \log\left(\frac{q_{ij}(1)}{q_{ij}(0)}\right). \quad (4)$$

The iterative decoding algorithm for LDPC 44 involves the following steps:

(1) Step 0. Initialize. LDPC decoder 44 begins with prior log-likelihood ratios for the bits $x_i$, as indicated below:

$$LLR^{prior}(x_i) = \log\frac{p_i^{prior}(1)}{p_i^{prior}(0)}. \quad (4)$$

(2) Step 1. Messages from bits to checks. LDPC decoder 44 processes LLR value summations from bits $x_i$ to checks $c_i$ as indicated below:

$$LLR(q_{ij}) = \sum_{j' \in Col[i]\setminus\{j\}} LLR(r_{ij'}) + LLR^{prior}(x_i). \quad (5)$$

(3) Step 2. Messages from checks to bits. LDPC decoder 44 processes LLR value summations from checks $c_i$ to bits $x_i$ as indicated below:

$$LLR(r_{ij}) = \quad (6)$$

$$f\left(\sum_{i' \in Row[j]\setminus\{i\}} f(|LLR(q_{i'j})|)\right) \cdot \prod_{i' \in Row[j]\setminus\{i\}} sgn(LLR(q_{i'j})) \cdot (-1)^{|Row[j]|}$$

where $f(x) = \log\frac{e^x+1}{e^x-1}$.

(4) Step 3. Update the message. LDPC decoder 44 outputs the posterior LLR when the iterations are complete, as follows:

$$LLR^{posterior}(x_i) = \sum_{j' \in Col[i]} LLR(r_{ij'}) + LLR^{prior}(x_i). \quad (7)$$

Note that the notation i'∈Row[j]\{i} identifies the indices i' (1≦i'≦n) of all bits in row j (1≦j≦m) which have value 1, excluding the current bit index, i. There are several criteria for deciding when to stop the message-passing algorithm for LDPC codes. For example, the iterations may continue for a fixed number of iterations or until the codewords are valid. Although the latter requires additional hardware cost to realize the validity checking algorithm, the average number of iterations can be significantly reduced. After each iteration, it is possible to make hard-decisions based on the log-likelihood ratios, as represented below:

$$x_i = \begin{cases} 1 & \text{if } LLR^{posterior}(x_i) \geq 0 \\ 0 & \text{if } LLR^{posterior}(x_i) < 0 \end{cases}. \quad (8)$$

To reduce computational complexity, in accordance with the invention, LDPC decoder 44 can be configured to carry out an approximation of equation (6) above. In particular, equation (6) can be simplified by observing that the summation is usually dominated by the minimum term, giving the approximation:

$$LLR(r_{ij}) \approx \min_{i' \in Row[j]\setminus\{i\}} |LLR(q_{i'j})| \cdot \prod_{i' \in Row[j]\setminus\{i\}} sgn(LLR(q_{i'j})) \cdot (-1)^{|Row[j]|} \quad (9)$$

This approximation supports a method of reduced complexity decoding, and simplifies the associated decoding architecture. In particular, the approximate decoding algorithm (9) for LDPC codes can be implemented with a minimum set of functions, additions and some binary arithmetic. Moreover, the approximate decoding algorithm (9) can be applied directly to the AWGN channel without the need for an estimate of the noise variance of the channel.

The standard message-passing equation (6) generally requires look-up-tables for the realization of the non-linear function. Also, the function f(x) in the standard message-passing equation (6) is sensitive to the number of quantization bits because its slope decreases with increasing x. A good performance-complexity tradeoff can be achieved, however, using the approximation of the message-passing equation as set forth in equation (9) instead of using the standard message-passing equation (6). Accordingly, use of the approximation (9) of the message-passing equation in LDPC decoder 44 can provide significant computational performance advantages.

Advantageously, the message-passing algorithm depicted on the bipartite graph of FIG. 5 maps extremely well to a parallel decoder architecture. The graph representation of an LDPC code shows that the computational dependencies for any node depend only on nodes of the opposite type, i.e., parity check node versus bit node. This characteristic allows bit nodes or check nodes to be updated in a block-parallel manner, enabling very high throughput. On the contrary, turbo decoding generally is realized using block-serial dependencies.

Figure 10:
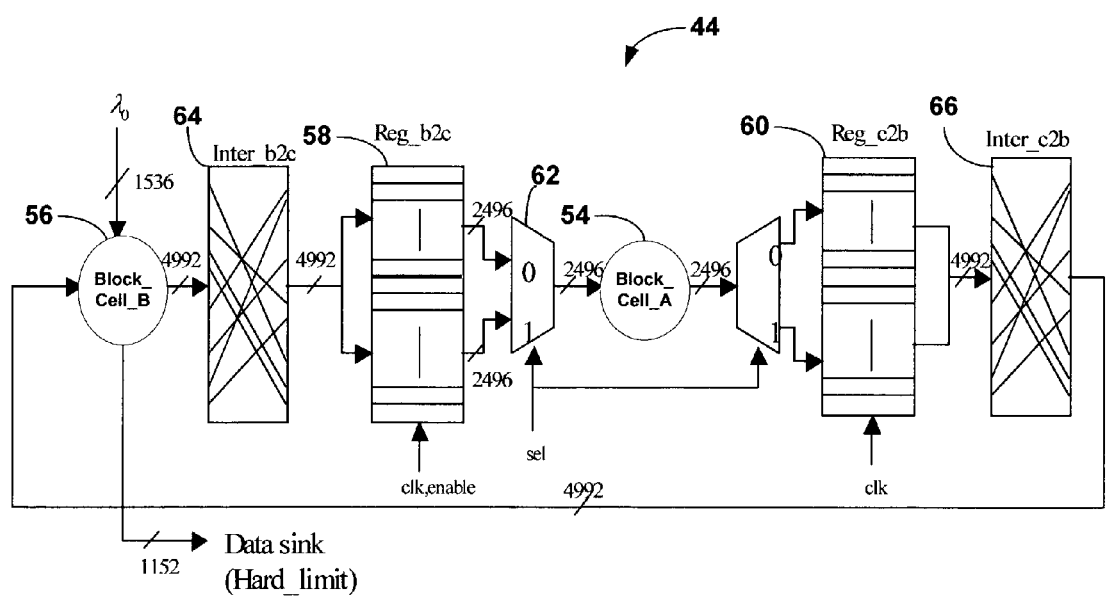
FIG. 10 is a block diagram illustrating an exemplary embodiment of an LDPC decoder architecture.

FIG. 10 is a block diagram illustrating an exemplary embodiment of LDPC decoder 44 in greater detail. The architecture of LDPC decoder 44 exploits hardware sharing techniques to share some computational nodes, leading to an area-efficient structure that is especially advantageous for small, mobile devices such as wireless communication devices 16. The architecture of LDPC decoder 44 carries out bit-to-check and check-to-bit computations that communicate with each other by passing messages. In accordance with the invention, LDPC decoder 44 may comprise several components including Block_Cell_A 54, Block_Cell_B 56, Reg_b2c 58, Reg_c2b 60, MUX 62, Inter_b2c 64, and Inter_c2b 66, each of which will be described in greater detail below. Block_Cell_A serves as a first computation unit that iteratively computes messages for LDPC encoded information from check nodes to bit nodes based on an approximation of the LDPC message passing algorithm. Block_Cell_B serves as a second computation unit, responsive to the first computation unit, that iteratively computes messages for the LDPC encoded information from the bit nodes to the check nodes to produce a hard decoding decision.

Block_Cell_B 56 computes messages from bit to check nodes, and Block_Cell_A 54 computes the messages from check to bit nodes. Following a number of iterations, Block_Cell_B 56 produces a hard decoding decision (Hard_Limit). In the example of FIG. 10, LDPC decoder 44 is configured to handle (1536, 1152) LDPC codes with code rate 3/4. Note that each message is 5 bits long and there are 4992 edges, requiring 4992*5 bits=24960 bits. In a fully parallel mode, 384 Cell_As are needed in Block_Cell_A 56. In a hardware sharing mode, a lesser number of Cell_As can be used in Block_Cell_A 56 in order to reduce area requirements. The hardware sharing factor (HSF) is a function of the number of Cell_As in Block_Cell_A 56. Therefore, according to the architecture of FIG. 10, the number of Cell_As is made adjustable according to the area requirements. In particular, the number of Cell_As is scalable between 384 (fully parallel), 192, 96, 48, 24, 12, 6, 3, and 1 (fully serial). The hardware sharing technique contemplated herein serves to balance area and latency.

LDPC decoder 44 begins by processing the initial soft information, $\lambda_0$, which is a log-likelihood probability for each bit with the signed 2's complement representation as a sign bit and 4 magnitude bits. In particular, the messages from bit to check nodes are first computed in Block_Cell_B 56 in fully parallel mode. The computed messages then are interleaved by Inter_b2c 64, which rearranges the incoming messages independently according to the corresponding permutation pattern. Interb_2c 64 is implemented by metal layers in LDPC decoder 44 according to the order of the permutation. The interleaved messages then are stored in register Reg_b2c 58, which may be realized by positive-edge triggered D flip-flops.

Half of the messages in Reg_b2c 58 are fed into Block_Cell_A 54 for computing the message from check to bit nodes. According to this example, the messages computed by Block_Cell_A 54 then are stored in the upper half of register Reg_c2b 60 in one clock cycle. The remaining messages are processed in the same way as the previous messages in a subsequent clock cycle. The messages in Reg_c2b 60 are interleaved by Inter_c2b 64 in parallel mode and then fed back into Block_Cell_B 56 for further iterations. In this case, the required clock cycles to process a block with maximum iteration=8 is (1+8×3)=25 $T_{clk}$, where $T_{clk}$ is the clock cycle.

A challenge for implementing LDPC decoder 44 is to construct the memory (Reg_b2c 58 and Reg_c2b 60) and interleavers (Inter_b2c 62 and Inter_c2b 64) efficiently because the memory requires significant area, and the interleaver causes routing congestion due to the need for several metal layers. If SRAM is used for memory instead of D flip-flops, the routing congestion can be avoided. However, SRAM generally requires more complex control logic and additional latency.

Figure 11:
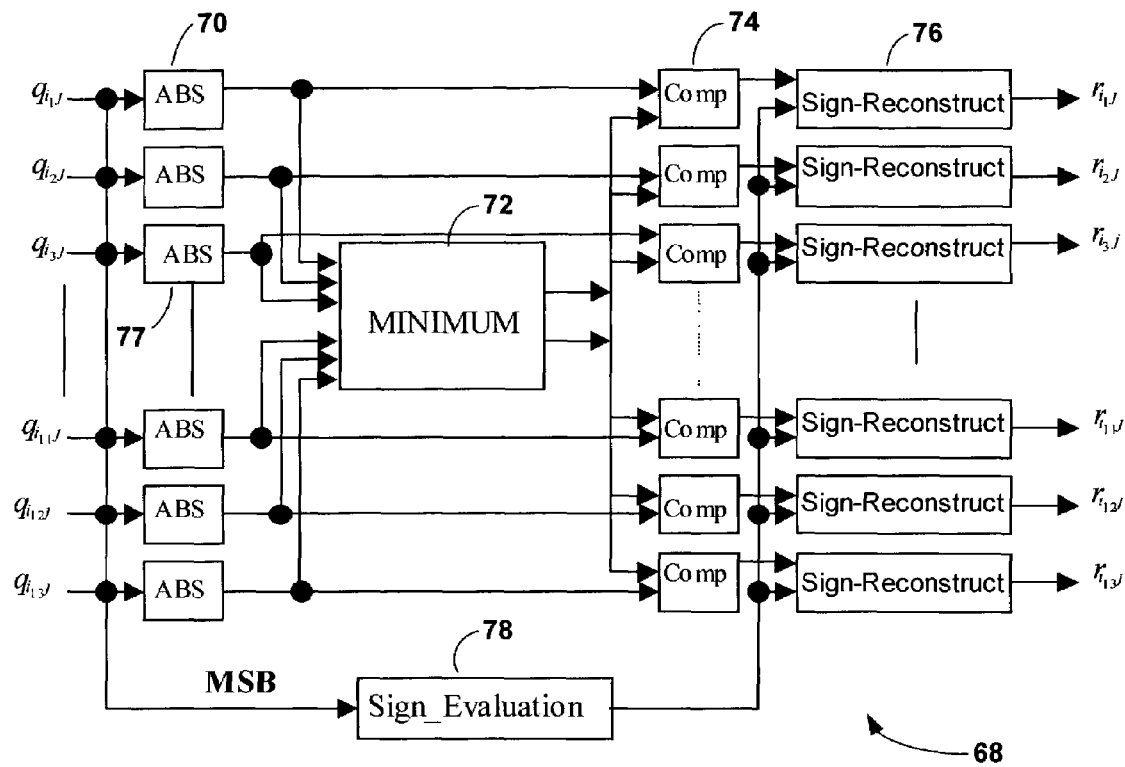
FIG. 11 is a block diagram illustrating the structure of a check to bit computation unit for computing messages from check to bit nodes.

FIG. 11 is a block diagram illustrating the structure of a Cell_A unit 68 within Block_Cell_A 54 for computing messages from check to bit nodes. According to this example, each parity check node in LDPC encoder 44 performs parity checks on thirteen bit nodes. The messages from checks to bits are evaluated by Block_Cell_A 54 according to the following equation:

$$LLR(r_{ij}) = f\left(\sum_{i' \in Row[j]\setminus\{i\}} f(|LLR(q_{i'j})|)\right). \tag{9}$$

$$\prod_{i' \in Row[j]\setminus\{i\}} sgn(LLR(q_{i'j})) \cdot (-1)^{|Row[j]|}$$

$$\approx \min_{i' \in Row[j]\setminus\{i\}} |LLR(q_{i'j})| \cdot$$

$$\prod_{i' \in Row[j]\setminus\{i\}} sgn(LLR(q_{i'j})) \cdot (-1)^{|Row[j]|}$$

Again, the above equation serves as an approximation of the standard message-passing algorithm for LDPC decoding. As shown in FIG. 11, each Cell_A unit 68 may include multiple absolute value units (block-ABS) 70, a minimum determination unit 72, multiple comparator units (block-Comp) 74, multiple sign reconstruction units (block Sign-Reconstruct) 76, and a sign-evaluation unit (Sign_Evaluation) 78.

In the example of FIG. 11, the LDPC block code has a total of 382 parity check nodes, where each parity check j in Cell_A check to bit unit 68 computes $r_{i,j}$ using entries from 13 bit nodes $i_1, i_2, \ldots, i_{13}$. Using 2's complement representation, the most-significant bit (MSB) of the messages is a sign bit. Therefore, the product is computed in sign-evaluation unit 78, which may be realized by XOR gates. The summation in the message passing equation (6) is usually dominated by the minimum term. Therefore, the use of approximation (9) of the standard message-passing algorithm for computation of messages from check to bit nodes provides a method for reduced complexity decoding which can be constructed by finding the minimum value using minimum value unit 72.

Block-ABS 70 converts the signed 2's complement messages into unsigned messages to obtain the absolute value. To keep the computation parallel in finding the minimum value, it is desirable to retain the two lowest values, produced by minimum value unit 72, because the minimum value for each message is always one of the two lowest values. Finally, the minimum value for each message is evaluated in block-Comp 74, which selects one of two lowest values. The final messages from check to bit nodes, $r_{i,j}$, are converted into the signed 2's complement number by block-Sign-Reconstruct 76 according to the result from sign evaluation unit 78.

Figure 12:
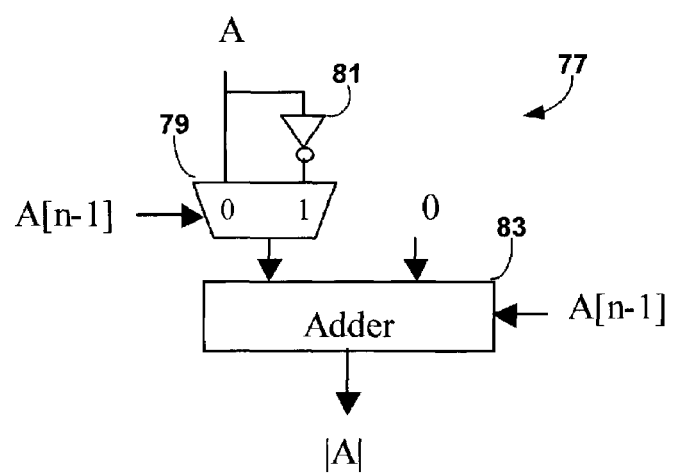
FIG. 12 is a logic diagram illustrating an absolute value unit in the check to bit computation unit of FIG. 11.

FIG. 12 is a logic diagram illustrating an absolute value unit 77 in the Cell_A check to bit unit 68 of FIG. 11. In particular, FIG. 12 illustrates an absolute value unit 77 for use in block-ABS 70 in processing one of the entries at bit nodes $i_1, i_2, \ldots, i_{13}$. As shown in FIG. 12, absolute value unit 77 includes a multiplexer 79 that receives an entry and an inverted entry via inverter 81. An adder 83 adds the output of multiplexer 79 to 0 to produce output |A|. In other words, absolute value unit 77 converts the signed 2's complement number A into the unsigned number |A|. If the most significant bit (MSB) of input A is equal to 0, the output |A| is the same as the input because the input is a positive number. Otherwise, the output is obtained by $\overline{A}+0+1=-A$ because the input is a negative number.

Figure 13:
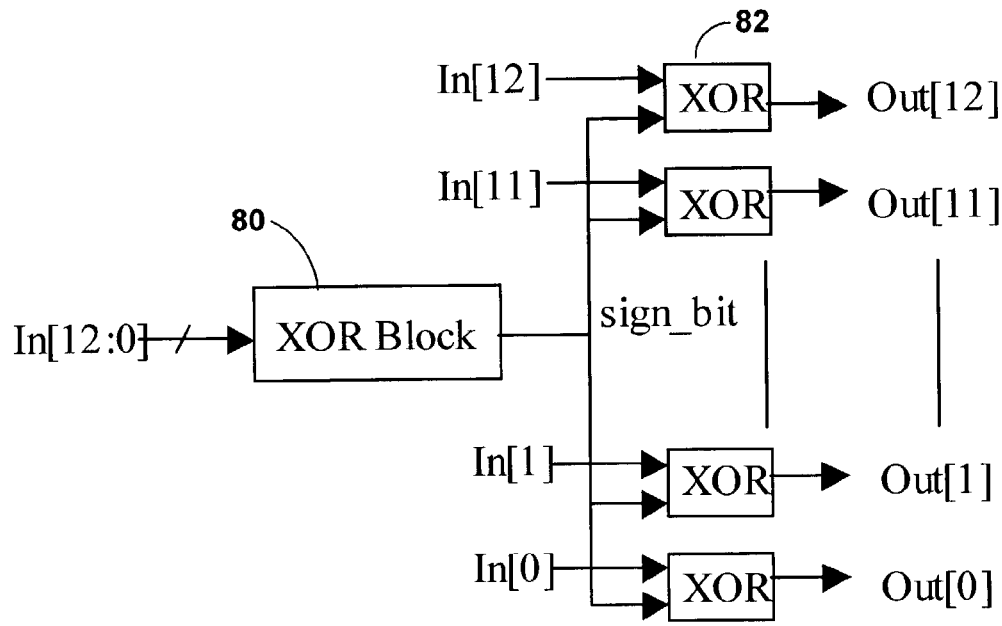
FIG. 13 is a logic diagram illustrating a sign evaluation unit in the check to bit computation unit of FIG. 11.

FIG. 13 is a logic diagram illustrating a sign evaluation unit 78 in the Cell_A check to bit unit 68 of FIG. 11. The function for evaluating the sign bit for all messages in Cell_A unit 68 can be defined by:

$$\prod_{i' \in Row[j]\setminus\{i\}} sgn(LLR(q_{i'j})). \tag{11}$$

The sign bit of each message is computed by performing an XOR function between the total sign bit and the sign bit of each message. As an example, the output of the expression $sgn(x_1)=(x_2 \oplus x_3 \ldots \oplus x_{13})$ can be obtained by $(x_1 \oplus x_2 \oplus x_3 \ldots \oplus x_{13}) \oplus x_1$. To implement this function, sign evaluation unit 78 includes XOR block 80 that operates on inputs 12:0 and an array of XOR units 82 that operates on the output of XOR block 80 and individual inputs 12:0.

Figure 14A:
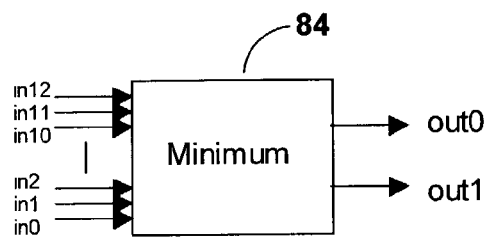
FIG. 14A is a block diagram illustrating a minimum determination unit in the check to bit computation unit of FIG. 11.
Figure 14B:
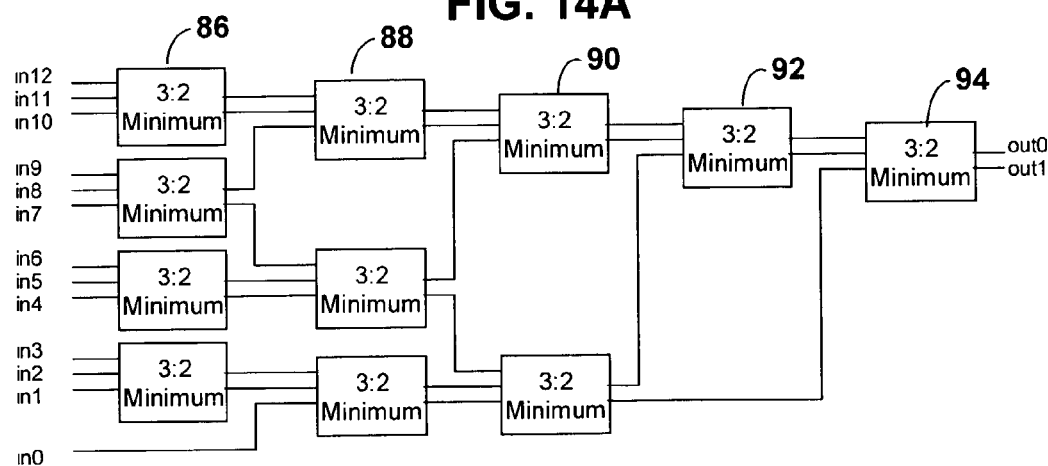
FIG. 14B is a logic diagram illustrating the minimum determination unit of FIG. 14A.

FIG. 14A is a block diagram illustrating minimum determination unit 72 in the Cell_A check to bit unit 68 of FIG. 11. FIG. 14B is a logic diagram illustrating minimum determination unit 72 of FIG. 14A in greater detail. As shown in FIG. 14B, minimum determination unit 72 may include a series of minimum value stages 86, 88, 90, 92, 94. In stages 86, 88, 90, 92, 94, minimum determination unit 72 finds the two lowest values of the messages in each group of three massages, so that one of the minimum values is selected for the final result. Hence, in the example of FIG. 14B, minimum determination unit 72 includes eleven 3:2-Minimum blocks. Each 3:2-Minimum block can be constructed by three comparators and multiplexers. One of the two lowest values is selected to obtain the final minimum value for each message.

Figure 15A:
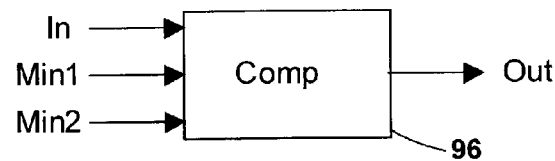
FIG. 15A is a block diagram illustrating a comparator unit in the check to bit computation unit of FIG. 11.
Figure 15B:
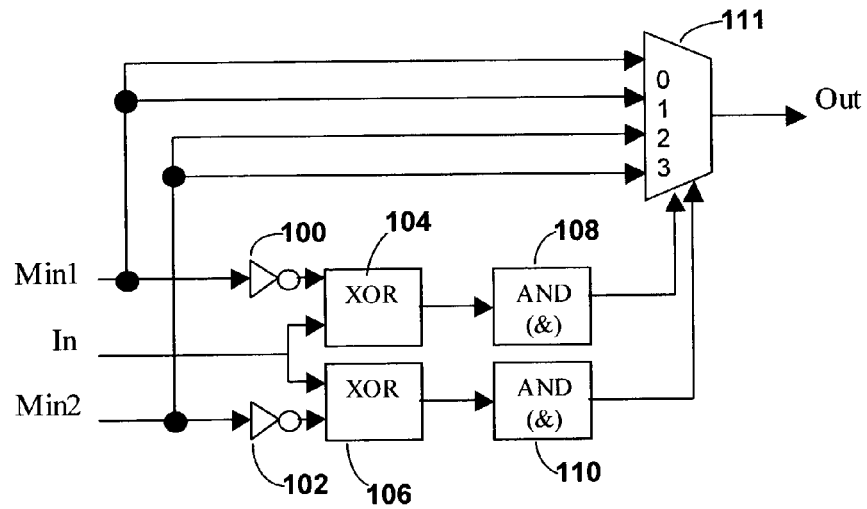
FIG. 15B is a logic diagram illustrating the comparator unit of FIG. 15A.

FIG. 15A is a block diagram illustrating comparator unit 96 within block-Comp 74. FIG. 15B is a logic diagram illustrating comparator unit 96 of FIG. 15A in greater detail. Comparator unit 96 compares the two lowest values output by minimum determination unit 72 with a respective input entry from block-ABS 70 to produce a minimum output. For example, each comparator unit 96 in block-COMP 74 may implement the algorithm represented by the following operations:

If(In==Min1)&(In==Min2) then Out<=Min2 or (Min1);
elseif(In==Min1)&(In~=Min2) then out<=Min2;
elseif(In~=Min1)&(In==Min2) then out<=Min1;
elseif(In~=Min1)&(In~=Min2) then out<=Min1;

As shown in FIG. 15B, each comparator unit 96 may be implemented by a combination of inverters 100, 102, XOR gates 104, 106, AND gates 108, 110, and 4-to-1 multiplexer 111 that outputs the lowest of the two values Min1, Min 2.

Figure 16A:
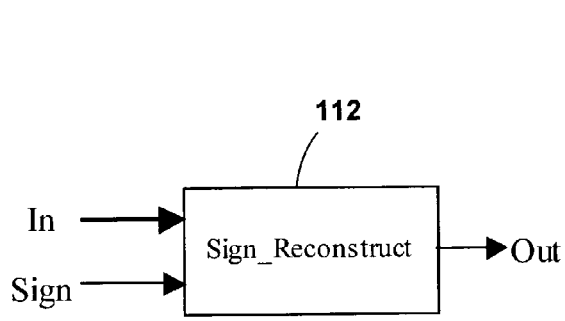
FIG. 16A is a block diagram illustrating a sign reconstruction unit in the check to bit computation unit of FIG. 11.
Figure 16B:
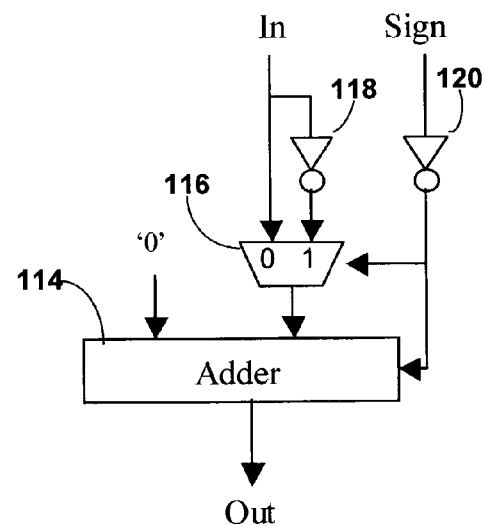
FIG. 16B is a logic diagram illustrating the sign reconstruction unit of FIG. 16A.

FIG. 16A is a block diagram illustrating a sign reconstruction unit 112 in block Sign-Reconstruct 76 of FIG. 11. FIG. 16B is a logic diagram illustrating sign reconstruction unit 112 of FIG. 16A in greater detail. At the final stage in block-Cell_A 54, the positive messages are converted into the signed 2's complement numbers according to the sign bit from the block Sign-Evaluation 78. As shown in FIG. 16A, a sign reconstruction unit 112 within block Sign-Reconstruct 76 receives as inputs the output (In) of a respective comparator unit 96 and the sign output (Sign) of sign evaluation unit 78. In equation (6), the final sign bit of a message is determined by:

$$\prod_{i' \in Row[j] \setminus \{i\}} sgn(LLR(q_{i'j})) \cdot (-1)^{|Row[j]|}. \quad (12)$$

The number of 1's in a row in the parity matrix is 13, so the sign bit depends on the equation:

$$\prod_{i' \in Row[j] \setminus \{i\}} sgn(LLR(q_{i'j})) \cdot (-1). \quad (13)$$

If the sign bit from the block-Sign-Evaluation 78 is equal to 0, the final sign bit must be 1. Otherwise, the final sign bit must be 0. As shown in FIG. 16B, the sign reconstruction function can be constructed using a five-bit adder 114, a 2-1 multiplexer 116, and inverters 118, 120. Multiplexer 116 passes either the block-Comp output or the inverted block-Comp output (via inverter 118) depending on the sign passed to control multiplexer 116 by inverter 120.

FIG. 17 is a block diagram illustrating the structure of Block_Cell_B bit to check unit 56 for computing messages from bit to check nodes. As shown in FIG. 17, Block_Cell_B 56 accommodates each of the 1536 bit nodes in LDPC decoder 44 to compute $q_{ij}$ using entries from four different check nodes and prior information. The messages from bit nodes to check nodes are computed by:

$$LLR(q_{ij}) = \sum_{j' \in Col[i] \setminus \{j\}} LLR(r_{ij'}) + LLR(P^{prior}(x_i)). \quad (14)$$

Block_Cell_B 56 may include an adder array and a saturation logic function. As shown in FIG. 17, for example, Block_Cell_B 56 may include an udder 124 that sums nodes r1 and r2, an adder 126 that sums nodes r3 and r4, an adder 128 that sums the outputs of adders 124, 126, and an adder that sums the output of adder 128 with $P(x_1)^{prior}$ to produce the MSB for $x_i$. A stage of adders 132 then sums the output of adder 128 with respective nodes r1, r2, r3, r4. In this manner, outgoing messages are formed as the group sum minus the input message of each individual edge through the adder array. If overflows occur, the intermediate value is saturated to the maximum possible value through the components identified as saturation units 134. With the structure illustrated in FIG. 17, hard-decision from soft information is decided by the MSB using the summation of all incoming messages.

FIG. 18A is a block diagram illustrating a saturation unit 134 for the bit to check unit of FIG. 17. FIG. 18B is a logic diagram illustrating saturation unit 134 of FIG. 18A in greater detail. In this example, it is assumed that the quantization bits for the soft information is 5-bit. The intermediate result after summation is 8-bit long, resulting in saturation to the 5-bit level. If the sign-bit is 1 and the input value is larger than the output value, the result should be saturated to "10000." If the sign-bit is 0 and the input value is larger than the output value, the result should be saturated to "01111." Otherwise, the result should be the same as the input. As shown in FIG. 18B, the function of saturation unit 134 can be realized by AND gates 138, 140, OR gate 142, inverter 144 and 2:1 multiplexer 146.

Figure 19A:
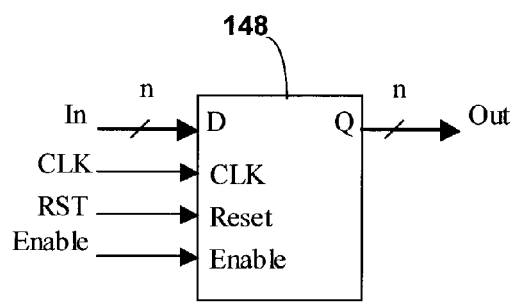
FIG. 19A is a block diagram illustrating a bit to check register in fully parallel mode.
Figure 19B:
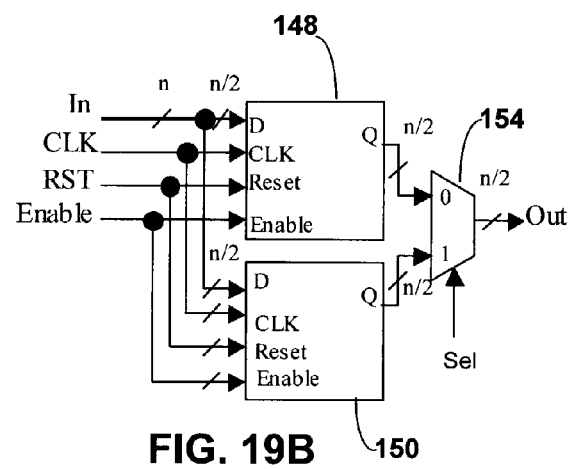
FIG. 19B is a block diagram illustrating a bit to check register in half hardware sharing mode.
Figure 19C:
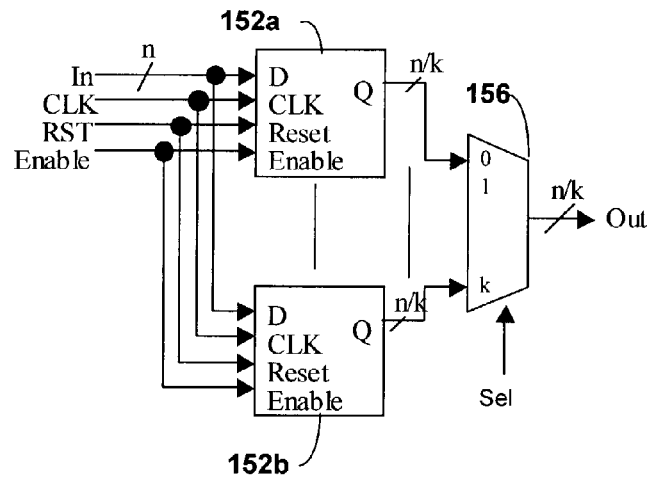
FIG. 19C is a block diagram illustrating a bit to check register in 1/k hardware sharing mode.

FIG. 19A is a block diagram illustrating a bit to check register 148 in fully parallel mode. FIG. 19B is a block diagram illustrating a bit to check register in half hardware sharing mode, as indicated by registers 148, 150 and multiplexer 154. FIG. 19C is a block diagram illustrating a bit to check register in 1/k hardware sharing mode, as indicated by registers $152_a$ through $152_k$ and multiplexer 156. Each memory arrangement depicted in FIGS. 19A, 19B, and 19C is possible for implementation. One challenge when implementing the message-passing algorithm for decoding LDPC codes in LDPC decoder 44 is to design the memory to hold the messages. As the functionality of both the check and variable nodes is very simple, their respective realizations are straightforward. Implementing the message passing between the nodes results in very different challenges depending on whether a hardware sharing or parallel decoder architecture is determined.

Due to randomness of connectivity on the bipartite graph representing a parity check matrix, the two classes of computations over a single block of inputs, bit-to-check and check-to-bit, cannot be overslapped. To simplify the control logic, LDPC decoder 44 may incorporate memory is implemented by D flip-flops. The required memory for LDPC decoder 44 in a fully parallel mode, configured to handle (1536,1152) LDPC codes with code rate 3/4, is 5×4992=24960 D flip-flops for storing intermediate messages form check to bit nodes because there exist 4992 edges and message passing on an edge can be represented with a 5-bit value. The memory for LDPC decoder 44 includes a bit-to-check memory and a check-to-bit memory to hold intermediate messages, so the total number of registers required for LDPC is equal to 2×5×4992=49920 D flip-flops with the 5 quantization bits for soft information.

The memory for each message from bit to check nodes can be implemented by D flip-flops 150, 152 and a multiplexer 154, as shown in FIG. 19B. For purposes of illustration, FIG. 19B illustrates a bit to check register in half hardware sharing mode, using two flip flops 148, 150. For increased hardware sharing, the number of flip flops can be scaled upward, as shown in the example of FIG. 19C. The memory from bit to check nodes accepts inputs in parallel, and generates outputs in parallel or serial according to the factor of hardware sharing. FIG. 19A shows memory for the parallel architecture which is constructed using only D flip-flops 148 without a multiplexer. In this manner, the message from bit to check nodes can be processed in one clock cycle, so that the parallel architecture obtains high throughput. Alternatively, the memory arrangement contemplated by the half hardware sharing scheme of FIG. 19B is divided into two registers 150, 152, which accept inputs in parallel at the same time. During the first clock cycle, the messages of the upper register 150 are loaded through multiplexer 154, and the messages of the lower register 152 are loaded during the second clock cycle.

Figure 20A:
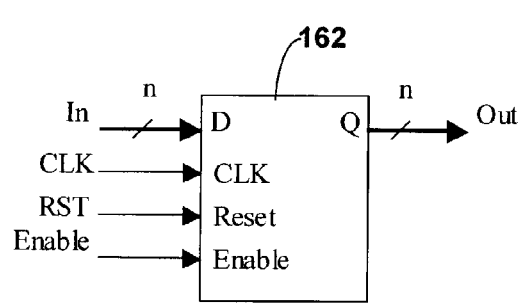
FIG. 20A is a block diagram illustrating a check to bit register in fully parallel mode.
Figure 20B:
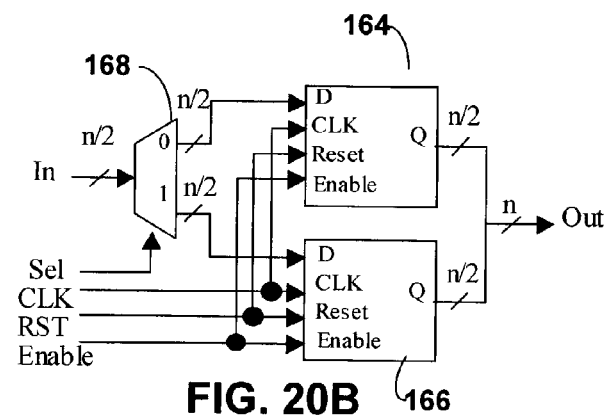
FIG. 20B is a block diagram illustrating a check to bit register in half hardware sharing mode.
Figure 20C:
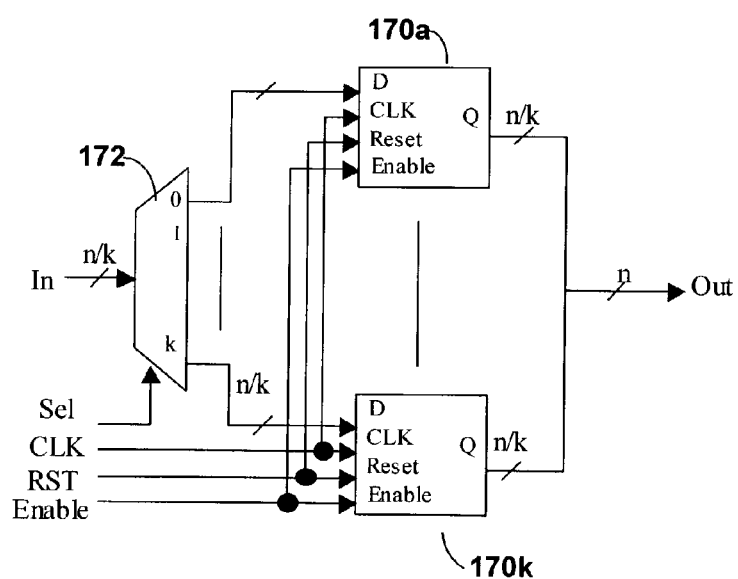
FIG. 20C is a block diagram illustrating a check to bit register in 1/k hardware sharing mode.

FIG. 20A is a block diagram illustrating a check to bit register 162 in fully parallel mode. FIG. 20B is a block diagram illustrating a check to bit register in half hardware sharing node, as indicated by registers 164, 166 and demultiplexer 168. FIG. 20C is a block diagram illustrating a check to bit register in 1/k hardware sharing mode, as indicated by registers $170_a$ through $170_k$ and demultiplexer 172. Memory from check to bit nodes can be implemented by D flip-flops and demultiplexers as shown in FIGS. 20B and 20C. The memory from check to bit nodes accepts inputs in block-serial and generates outputs in parallel.

The memory arrangement in FIG. 20A provides a fully parallel architecture, which is constructed using only D flip-flops. Therefore, the message from check to bit nodes can be processed in one clock cycle, leading to high throughput. FIG. 20B presents the memory architecture using the half hardware sharing technique, which is involves an arrangement of two registers 164, 166 and a demultiplexer 168. One-half of all messages is stored in the upper register 164 during the first clock cycle, and the rest of the messages re stored in the lower register 166 during the second clock cycle. Demultiplexer 168 serves to accept the messages in block serial mode for distribution to registers 164, 166.

EXAMPLE

As an example, an LDPC decoder conforming generally to the structure illustrated in FIG. 10 was implemented in a 0.18 μm, 1.8v UMC CMOS process using standard cells. TABLE 1 shows the area and propagation delay for each component for the LDPC decoder 44. The worst propagation delay of the Cell_A is 10.5 ns. Consequently, the clock frequency can be 80 MHz including a twenty percent safety-margin

TABLE 1

| Component | Area | Delay |
|---|---|---|
| Cell_A | 26,288 μm² | 10.5 ns |
| Cell_B1 | 374 μm² | 1.08 ns |
| Cell_B2 | 6,285 μm² | 3.39 ns |
| Bit-to-Check memory | 2,312,400 μm² | 0 |
| Check-to-Bit memory | 2,334,000 μm² | 0 |

TABLE 2

| | Total # of Cell_A | Total # of Cell_B | Total area of LDPC | Total # of clock cycles to process a block | Latency (μs) | Throughput |
|---|---|---|---|---|---|---|
| Serial ↑ | 1 | 1536 | 20.8 mm² | 3081 clock cycles | 61.6 | 18.7 Mbps |
| | 3 | 1536 | 20.9 mm² | 1033 clock cycles | 20.6 | 60 Mbps |
| | 6 | 1536 | 21 mm² | 521 clock cycles | 10.4 | 110 Mbps |
| | 12 | 1536 | 21.2 mm² | 265 clock cycles | 5.3 | 217 Mbps |
| | 24 | 1536 | 21.7 mm² | 137 clock cycles | 2.74 | 420 Mbps |
| | 48 | 1536 | 22.7 mm² | 73 clock cycles | 1.46 | 789 Mbps |
| Parallel ↓ | 96 | 1536 | 25.4 mm² | 41 clock cycles | 0.82 | 1.4 Gbps |
| | 192 | 1536 | 29.3 mm² | 25 clock cycles | 0.5 | 2.4 Gbps |
| | 384 | 1536 | 36.6 mm² | 17 clock cycles | 0.34 | 3.3 Gbps |

Cell_A (check to bit) is a bottleneck in LDPC decoder 44 because it needs more area than Cell_B (bit to check). Therefore, it is efficient to reduce the area so that the number of Cell_As becomes a factor of hardware-sharing. TABLE 2 shows the total area, latency, and throughput according to the number of Cell_As, with a clock frequency=50 MHz and maximum iteration=8. As indicated by TABLE 2, a fully parallel architecture for LDPC decoder 44 achieves high throughput but requires more area. Alternatively, a fully serial architecture for LDPC decoder 44 requires less area but produces low throughput. A balance between area and throughput can be achieved by providing a compromise between a fully parallel and fully serial architecture.

Figure 21:
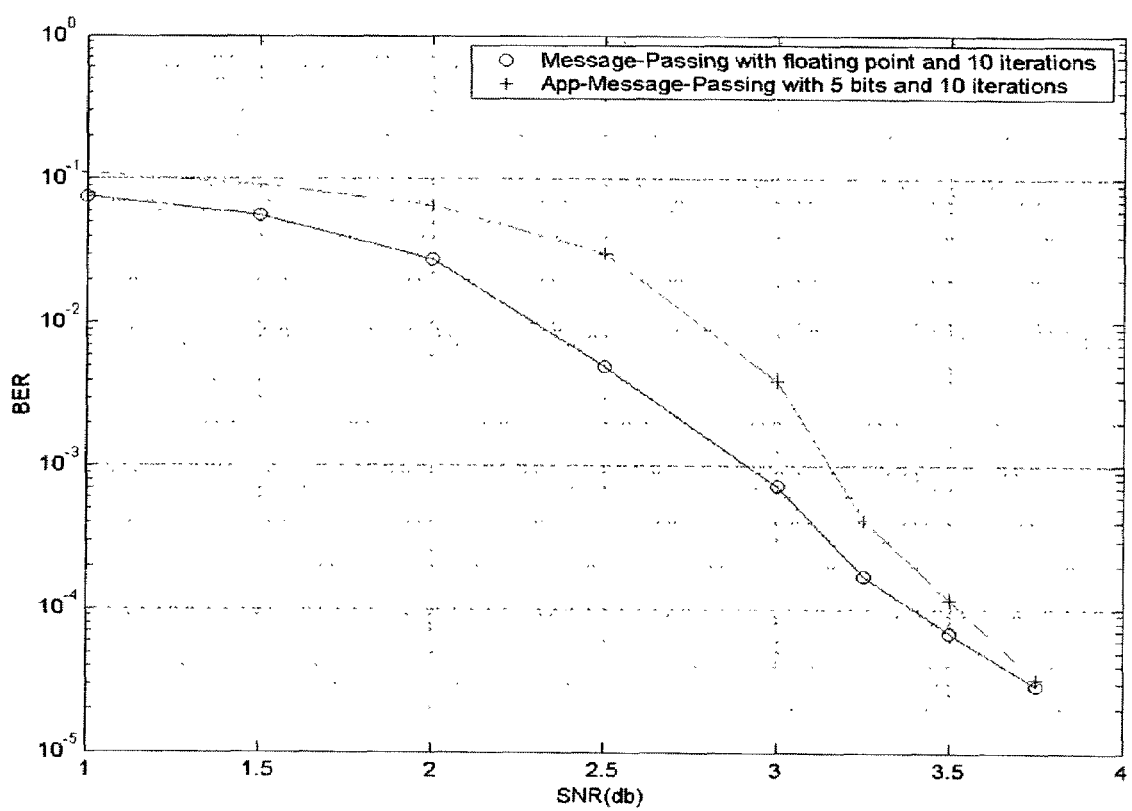
FIG. 21 is a graph illustrating floating precision simulation using a standard message-passing algorithm and 5-bit quantization precision using an approximation of the message-passing algorithm with a maximum iteration=10.

FIG. 21 is a graph illustrating a floating precision simulation for LDPC decoder 44 using a standard message-passing algorithm and 5-bit quantization precision using an approximation (9) of the standard message-passing algorithm (6) with a maximum iteration=10.

An LDPC decoder 44, in accordance with the embodiments described herein, can provide certain advantages. For example, the use of LDPC coding can provide exceptional performance. For example, LDPC codes are characterized by good distance properties that reduce the likelihood of undetected errors. In addition, LDPC codes permit implementation of low complexity, highly parallelizable decoding algorithms. Parallel processing, in turn, promotes low power consumption, high throughput and simple control logic. Availability of different degrees of serial processing, however, reduces area. Also, the intermediate results on each node of the LDPC decoder tend to converge to a certain value, resulting in low power consumption due to reduced switching activity. Moreover, the architectures contemplated by the invention are capable of delivering such advantages while balancing throughput, power consumption and area, making LDPC coding more attractive, especially in a wireless communication system.

Various embodiments of the invention have been described. These and other embodiments are within the scope of the following claims.

The invention claimed is:

1. A low density parity check (LDPC) decoder comprising:

a first computation unit that iteratively computes messages for LDPC encoded information from check nodes to bit nodes based on an approximation of the LDPC message passing algorithm, wherein the first computation unit computes at least some messages from a first one of the check nodes to one or more of the bit nodes and at least some messages from a second one of the check nodes to one or more of the bit nodes in block serial mode using shared hardware; and a second computation unit, responsive to the first computation unit, that iteratively computes messages for the LDPC encoded information from the bit nodes to the check nodes to produce a hard decoding decision.

2. The LDPC decoder of claim 1, wherein the first computation unit computes a first half of the messages in block serial mode using a first set of the shared hardware, and computes a second half of the messages in block serial mode using a second set of the shared hardware.

3. The LDPC decoder of claim 1, wherein the first computation unit computes multiple sets of 1/k of the messages in block serial mode using corresponding sets of the shared hardware.

4. The LDPC decoder of claim 1, wherein the encoded information is encoded with (1536,1152) LDPC codes having a code rate of 3/4.

5. A low density parity check (LDPC) decoder comprising:
a first computation unit that iteratively computes messages for LDPC encoded information from check nodes to bit nodes based on an approximation of the LDPC message passing algorithm; and
a second computation unit, responsive to the first computation unit, that iteratively computes messages for the LDPC encoded information from the bit nodes to the check nodes to produce a hard decoding decision, wherein the first computation unit computes the messages from check nodes to bit nodes according to an approximation of the LDPC message passing algorithm based on the following equation:

$$\min_{i' \in Row[j] \setminus \{i\}} |LLR(q_{i'j})| \cdot \prod_{i' \in Row[j] \setminus \{i\}} sgn(LLR(q_{i'j})) \cdot (-1)^{|Row[j]|},$$

wherein min represents a minimum function, LLR represents a log likelihood ratio, $q_{ij}$ represents a parity check bit value, i represents row weight of a parity check matrix, and j represents column weight of the parity check matrix.

6. The LDPC decoder of claim 5, wherein the first computation unit includes a minimum determination unit that evaluates $$\min_{i' \in Row[j] \setminus \{i\}} |LLR(q_{i'j})|$$

in parallel mode.

7. The LDPC decoder of claim 1, further comprising memory that stores intermediate messages produced by the first and second computation units.

8. The LDPC decoder of claim 7, wherein the memory includes an array of k D flip-flop registers, and the first computation unit computes multiple sets of 1/k of the messages in block serial mode and stores each of the sets in one of the k D flip-flop registers.

9. A low density parity check (LDPC) decoding method comprising:
iteratively computing messages for LDPC encoded information from check nodes to bit nodes based on an approximation of the LDPC message passing algorithm in a first computation unit, wherein at least some messages from a first one of the check nodes to one or more of the bit nodes and at least some messages from a second one of the check nodes to one or more of the bit nodes are computed in block serial mode using shared hardware; and
responsive to the first computation unit, iteratively computing messages for the LDPC encoded information from the bit nodes to the check nodes to produce a hard decoding decision in a second computation unit.

10. The method of claim 9, further comprising computing, in the first computation unit, a first half of the messages in block serial mode using a first set of the shared hardware, and a second half of the messages in block serial mode using a second set of the shared hardware.

11. The method of claim 9, further comprising computing, in the first computation unit, multiple sets of 1/k of the messages in block serial mode using corresponding sets of the shared hardware.

12. The method of claim 9, further comprising storing intermediate messages produced by the first and second computation units in memory.

13. The method of claim 12, wherein the memory includes an array of k D flip-flop registers, the method further comprising computing multiple sets of 1/k of the messages in block serial mode and storing each of the sets in one of the k D flip-flop registers.

14. The method of claim 9, wherein the encoded information is encoded with (1536,1152) LDPC codes having a code rate of 3/4.

15. A low density panty check (LDPC) decoding method comprising:
iteratively computing messages for LDPC encoded information from check nodes to bit nodes based on an approximation of the LDPC message passing algorithm in a first computation unit; and
responsive to the first computation unit, iteratively computing messages for the LDPC encoded information from the bit nodes to the check nodes to produce a hard decoding decision in a second computation unit, further comprising computing the messages from check nodes to bit nodes according to an approximation of the LDPC message passing algorithm based on the following equation:

$$\min_{i' \in Row[j] \setminus \{i\}} |LLR(q_{i'j})| \cdot \prod_{i' \in Row[j] \setminus \{i\}} sgn(LLR(q_{i'j})) \cdot (-1)^{|Row[j]|},$$

wherein min represents a minimum function, LLR represents a log likelihood ratio, $q_{i,j}$ represents a parity check bit value, i represents row weight of a parity check matrix, and j represents column weight of the parity check matrix.

16. The method of claim 15, further comprising evaluating $$\min_{i' \in Row[j] \setminus \{i\}} |LLR(q_{i'j})|$$

in a parallel mode.

17. A low density parity check (LDPC) decoder comprising:
a first computation unit that iteratively computes messages for LDPC encoded information from check nodes to bit nodes, wherein the first computation unit computes at least some messages from a first one of the check nodes to one or more of the bit nodes and at least some messages from a second one of the check nodes to one or more of the bit nodes in block serial mode using shared hardware; and a second computation unit, responsive to the first computation unit, that iteratively computes messages for the LDPC encoded information from the bit nodes to the check nodes to produce a hard decoding decision.

18. The LDPC decoder of claim 17, wherein the first computation unit computes a first half of the messages in block serial mode using a first set of the shared hardware, and computes a second half of the messages in block serial mode using a second set of the shared hardware.

19. The LDPC decoder of claim 17, wherein the first computation unit computes multiple sets of 1/k of the messages in block serial mode using corresponding sets of the shared hardware.

20. The LDPC decoder of claim 17, wherein the first computation unit computes the messages from check nodes to bit nodes according to an approximation of the LDPC message passing algorithm based on the following equation:

$$\min_{i' \in Row[j] \setminus \{i\}} |LLR(q_{i'j})| \cdot \prod_{i' \in Row[j] \setminus \{i\}} sgn(LLR(q_{i'j})) \cdot (-1)^{|Row[j]|},$$

wherein min represents a minimum function, LLR represents a log likelihood ratio, $q_{i,j}$ represents a parity check bit value, i represents row weight of a parity check matrix, and j represents column weight of the parity check matrix.

21. The LDPC decoder of claim 20, wherein the first computation unit includes a minimum determination unit that evaluates $$\min_{i' \in Row[j] \setminus \{i\}} |LLR(q_{i'j})|$$

in parallel mode.

22. The LDPC decoder of claim 17, further comprising memory that stores intermediate messages produced by the first and second computation units.

23. The LDPC decoder of claim 22, wherein the memory includes an array of k D flip-flop registers, and the first computation unit computes multiple sets of 1/k of the messages in block serial mode and stores each of the sets in one of the k D flip-flop registers.

24. The LDPC decoder of claim 17, wherein the encoded information is encoded with (1536,1152) LDPC codes having a code rate of 3/4.

25. A low density panty check (LDPC) decoding method comprising:

iteratively computing messages for LDPC encoded information from check nodes to bit nodes, wherein at least some messages from a first one of the check nodes to one or more of the bit nodes and at least some messages from a second one of the check nodes to one or more of the bit nodes are computed in block serial mode using shared hardware in a first computation unit; and responsive to the first computation unit, iteratively computing messages for the LDPC encoded information from the bit nodes to the check nodes to produce a hard decoding decision in a second computation unit.

26. The method of claim 25, further comprising computing, in the first computation unit, a first half of the messages in block serial mode using a first set of the shared hardware, and a second half of the messages in block serial mode using a second set of the shared hardware.

27. The method of claim 25, further comprising computing, in the first computation unit, multiple sets of 1/k of the messages in block serial mode using corresponding sets of the shared hardware.

28. The method of claim 25, further comprising computing the messages from check nodes to bit nodes according to an approximation of the LDPC message passing algorithm based on the following equation:

$$\min_{i' \in Row[j] \setminus \{i\}} |LLR(q_{i'j})| \cdot \prod_{i' \in Row[j] \setminus \{i\}} sgn(LLR(q_{i'j})) \cdot (-1)^{|Row[j]|},$$

wherein min represents a minimum function, LLR represents a log likelihood ratio, $q_{i,j}$ represents a parity check bit value, i represents row weight of a parity check matrix, and j represents column weight of the parity check matrix.

29. The method of claim 28, further comprising evaluating $$\min_{i' \in Row[j] \setminus \{i\}} |LLR(q_{i'j})|$$

in a parallel mode.

30. The method of claim 25, further comprising storing intermediate messages produced by the first and second computation units in memory.

31. The method of claim 30, wherein the memory includes an array of k D flip-flop registers, the method further comprising computing multiple sets of 1/k of the messages in block serial mode and storing each of the sets in one of the k D flip-flop registers.

32. The method of claim 25, wherein the encoded information is encoded with (1536,1152) LDPC codes having a code rate of 3/4.

33. A wireless communication device comprising:

a radio circuit that receives radio frequency signals;

a modem that demodulates the received signals, wherein the signals are encoded with low density parity check (LDPC) codes; and an LDPC decoder including:

a first computation unit that iteratively computes messages for LDPC encoded information from check nodes to bit nodes based on an approximation of the LDPC message passing algorithm, wherein the first computation unit computes at least some messages from a first one of the check nodes to one or more of the bit nodes and at least some messages from a second one of the check nodes to one or more of the bit nodes in block serial mode using shared hardware; and a second computation unit, responsive to the first computation unit, that iteratively computes messages for the LDPC encoded information from the bit nodes to the check nodes to produce a hard decoding decision.

34. The wireless communication device of claim 33, wherein the signals include orthogonal frequency division modulation (OFDM) signals, and the modem includes an FFT unit that demodulates the OFDM signals.

35. The wireless communication device of claim 33, wherein the signals include signals transmitted according to the IEEE 802.11a standard.

36. A wireless communication device comprising:
a radio circuit that receives radio frequency signals;
a modem that demodulates the received signals, wherein the signals are encoded with low density parity check (LDPC) codes; and
a low density parity check (LDPC) decoder including:
a first computation unit that iteratively computes messages for LDPC encoded information from check nodes to bit nodes, wherein the first computation unit computes at least some messages from a first one of the check nodes to one or more of the bit nodes and at least some messages from a second one of the check nodes to one or more of the bit nodes in block serial mode using shared hardware; and
a second computation unit, responsive to the first computation unit, that iteratively computes messages for the LDPC encoded information from the bit nodes to the check nodes to produce a hard decoding decision.

37. The wireless communication device of claim 36, wherein the signals include orthogonal frequency division modulation (OFDM) signals, and the modem includes an FFT unit that demodulates the OFDM signals.

38. The wireless communication device of claim 36, wherein the signals include signals transmitted according to the IEEE 802.11a standard.

39. A low density parity check (LDPC) decoder comprising:
a first computation unit that iteratively computes messages for LDPC encoded information from check nodes to bit nodes, wherein the first computation unit computes at least some messages from a first one of the check nodes to one or more of the bit nodes and at least some messages from a second one of the check nodes to one or more of the bit nodes in block serial mode using shared hardware; and
a second computation unit that iteratively computes messages for the LDPC encoded information from the bit nodes to the check nodes.

40. The LDPC decoder of claim 39, wherein the first computation unit computes a first half of the messages in block serial mode using a first set of the shared hardware, and computes a second half of the messages in block serial mode using a second set of the shared hardware.

41. The LDPC decoder of claim 39, wherein the first computation unit computes multiple sets of 1/k of the messages in block serial mode using corresponding sets of to shared hardware.

42. The LDPC decoder of claim 39, wherein the first computation unit computes the messages from check nodes to bit nodes according to an approximation of the LDPC message passing algorithm based on the following equation:

$$\min_{i' \in Row[j] \setminus \{i\}} |LLR(q_{i'j})| \cdot \prod_{i' \in Row[j] \setminus \{i\}} sgn(LLR(q_{i'j})) \cdot (-1)^{|Row[j]|},$$

wherein min represents a minimum function, LLR represents a log likelihood ratio, $q_{i,j}$ represents a parity check bit value, i represents row weight of a parity check matrix, and j represents column weight of the parity check matrix.

43. The LDPC decoder of claim 42, wherein the first computation unit includes a minimum determination unit that evaluates $$\min_{i' \in Row[j] \setminus \{i\}} |LLR(q_{i'j})|$$

in parallel mode.

44. The LDPC decoder of claim 39, further comprising memory that stores intermediate messages produced by to first and second computation units, wherein the memory includes an array of k D flip-flop registers, and the first computation unit computes multiple sets of 1/k of the messages in block serial mode and stores each of the sets in one of the k D flip-flop registers.

45. The LDPC decoder of claim 39, wherein the encoded information is encoded with (1536,1152) LDPC codes having a code rate of 3/4.

46. A low density parity check (LDPC) decoding method comprising:
iteratively computing messages for LDPC encoded information from check nodes to bit nodes, wherein at least some messages from a first one of the check nodes to one or more of the bit nodes and at least some messages from a second one of the check nodes to one or more of the bit nodes are computed in block serial mode using shared hardware in a first computation unit; and
iteratively computing messages for the LDPC encoded information from the bit nodes to the check nodes in a second computation unit.

47. The method of claim 46, further comprising computing, in the first computation unit, a first half of the messages in block serial mode using a first set of the shared hardware, and a second half of the messages in block serial made using a second set of the shared hardware.

48. The method of claim 46, further comprising computing, in the first computation unit, multiple sets of 1/k of the messages in block serial mode using corresponding sets of the shared hardware.

49. The method of claim 46, further comprising computing the messages from check nodes to bit nodes according to an approximation of the LDPC message passing algorithm based on the following equation:

$$\min_{i' \in Row[j] \setminus \{i\}} |LLR(q_{i'j})| \cdot \prod_{i' \in Row[j] \setminus \{i\}} sgn(LLR(q_{i'j})) \cdot (-1)^{|Row[j]|},$$

wherein min represents a minimum function, LLR represents a log likelihood ratio, $q_{i,j}$ represents a parity check bit value, i represents row weight of a parity check matrix, and j represents column weight of the parity check matrix.

50. The method of claim 49, further comprising evaluating $$\min_{i' \in Row[j] \setminus \{i\}} |LLR(q_{i'j})|$$

in a parallel mode.

51. The method of claim 46, further comprising storing intermediate messages produced by the first and second computation units in memory, wherein the memory includes an array of k D flip-flop registers, the method further comprising computing multiple sets of 1/k of the messages in block serial mode and storing each of the sets in one of the k D flip-flop registers.

52. The method of claim 46, wherein the encoded information is encoded with (1536,1152) LDPC codes having a code rate of 3/4.

* * * * *

UNITED STATES PATENT AND TRADEMARK OFFICE
CERTIFICATE OF CORRECTION

PATENT NO. : 7,246,304 B2
APPLICATION NO. : 10/234059
DATED : July 17, 2007
INVENTOR(S) : Kim It is certified that error appears in the above-identified patent and that said Letters Patent is hereby corrected as shown below:

On Column 7, line 59, "$P_T$" should read --$P^T$--.

On Column 9, line 8, $(1 \leqq i' \leqq n)$ should read --$(1 \leq i' \leq n)$--.

On Column 9, line 8, $(1 \leqq j \leqq m)$ should read --$(1 \leq j \leq m)$--.

On Column 14, line 64, "modes" should read --nodes--.

On Column 22, line 6, "to" should read --the--.

Signed and Sealed this

Eleventh Day of March, 2008

JON W. DUDAS
*Director of the United States Patent and Trademark Office*